US012631670B2

(12) United States Patent
Lee et al.

(10) Patent No.: US 12,631,670 B2
(45) Date of Patent: May 19, 2026

(54) CURRENT SENSING DEVICE

(71) Applicant: Smart Electronics Inc., Ulsan (KR)

(72) Inventors: Jeong Bok Lee, Seoul (KR); Dong Choon Kim, Seoul (KR); Dong Hwa Kim, Seoul (KR)

(73) Assignee: SMART ELECTRONICS, INC., Ulsan (KR)

( * ) Notice: Subject to any disclaimer, the term of this patent is extended or adjusted under 35 U.S.C. 154(b) by 220 days.

(21) Appl. No.: 18/546,727

(22) PCT Filed: Feb. 14, 2022

(86) PCT No.: PCT/KR2022/002171
§ 371 (c)(1),
(2) Date: Aug. 16, 2023

(87) PCT Pub. No.: WO2022/177247
PCT Pub. Date: Aug. 25, 2022

(65) Prior Publication Data
US 2024/0133926 A1 Apr. 25, 2024
US 2024/0230726 A9 Jul. 11, 2024

(30) Foreign Application Priority Data

Feb. 17, 2021 (KR) ........................ 10-2021-0021007

(51) Int. Cl.
G01R 19/15 (2006.01)
G01R 1/04 (2006.01)
(Continued)

(52) U.S. Cl.
CPC .............. G01R 19/15 (2013.01); G01R 1/04 (2013.01); G01R 1/203 (2013.01); G01R 1/30 (2013.01); G01R 15/202 (2013.01)

(58) Field of Classification Search
CPC . G01R 1/04; G01R 1/30; G01R 1/203; G01R 15/20–26; G01R 19/00–16504;
(Continued)

(56) References Cited

U.S. PATENT DOCUMENTS 5,717,327 A * 2/1998 Bradford .............. G01R 15/146
324/117 R
2013/0259266 A1* 10/2013 Yayama ................ H03F 1/0211
381/120
(Continued)

FOREIGN PATENT DOCUMENTS

EP 3748369 A1 12/2020
JP 2011080970 4/2011
(Continued)

*Primary Examiner* — Lee E Rodak
*Assistant Examiner* — Jeremiah J Barron
(74) *Attorney, Agent, or Firm* — Cislo & Thomas LLP

(57) ABSTRACT

The present invention relates to a current sensing device comprising: a bus bar including a plurality of low-resistance metal portions separated from each other with a resistance portion therebetween; a printed circuit board arranged below the bus bar; a plurality of fixing pins which are joined to the metal portions of the bus bar to fix the bus bar on the printed circuit board and provide a current path between the metal portions and the printed circuit board; and at least one Hall sensor module. At least a portion of the Hall sensor module is inserted into a sensor hole formed in at least one of the low-resistance metal portions of the bus bar.

10 Claims, 10 Drawing Sheets

(51) Int. Cl.
    *G01R 1/20*        (2006.01)
    *G01R 1/30*        (2006.01)
    *G01R 15/20*     (2006.01)

(58) Field of Classification Search
    CPC .. H04Q 9/00; H04Q 2209/30; H04Q 2209/40;
                          G08C 17/02; G08C 19/02
    See application file for complete search history.

(56)                     References Cited

U.S. PATENT DOCUMENTS

| | | | |
|---|---|---|---|
| 2017/0261536 A1* | 9/2017 | Chae | .................... G01R 15/146 |
| 2017/0285634 A1* | 10/2017 | Chin | ...................... G08C 17/02 |
| 2020/0300919 A1 | 9/2020 | Song | |
| 2021/0048454 A1* | 2/2021 | Choi | ...................... G01R 1/203 |
| 2022/0091161 A1* | 3/2022 | Houis | ................ G01R 19/0007 |

FOREIGN PATENT DOCUMENTS

| | | |
|---|---|---|
| JP | 2011164008 | 8/2011 |
| JP | 2013044671 | 3/2013 |
| JP | 2015210272 | 11/2015 |
| KR | 20080036732 | 4/2008 |
| KR | 1020080036732 A | 4/2008 |
| KR | 20100092209 | 8/2010 |
| KR | 101374381 | 3/2014 |
| KR | 20150124358 | 11/2015 |
| KR | 101812245 | 12/2017 |
| KR | 101812245 B1 | 12/2017 |
| KR | 20200059000 A | 5/2020 |
| WO | WO2018107987 A1 | 6/2018 |

\* cited by examiner

CURRENT SENSING DEVICE

TECHNICAL FIELD

The present invention relates to a current sensing device using a dual sensor.

BACKGROUND ART

Current sensors are used in various industrial areas. Resistance detection type current sensors and magnetic field detection type current sensors are representative of current sensors. Shut sensors convert voltage drop caused by a shunt resistor into a current and measure the current. Hall sensors, in which a potential difference (Hall voltage) and a magnetic field are generated in the direction perpendicular to a current by the Hall effect around a conductor through which current flows, amplify the Hall voltage and measure the current proportional to the Hall voltage.

Shunt sensors and Hall sensors have different advantages and disadvantages. For example, while shunt sensors are simple to install and are inexpensive, power dissipation occurs in the shunt resistor and heat is generated. On the other hand, in the case of a Hall sensor, since it is a non-contact sensor, power loss is small, but it is larger than the shunt resistor since a relatively large core must be installed around a conductor. Shut sensors and Hall sensors differ in the accuracy of measurement values depending on the environment. For example, a shunt resistor has low accuracy when measuring a high current since the measured current value changes due to the heat generated in the shunt resistor.

DETAILED DESCRIPTION OF THE INVENTION

Technical Problem

An object of the present invention is to meet the needs and solve the problems.

In particular, the present invention provides a current sensing device capable of increasing the accuracy of a measured current value and enabling miniaturization by using a dual sensor.

Objects of the present invention should not be limited to the aforementioned objects and other unmentioned objects will be clearly understood by those skilled in the art from the following description.

Technical Solution

A current sensing device according to an embodiment of the present invention includes: a bus bar including a plurality of low-resistance metal portions separated from each other with a resistance portion therebetween; a printed circuit board arranged below the bus bar; a plurality of fixing pins which are joined to the metal portions of the bus bar to fix the bus bar on the printed circuit board and provide a current path between the metal portions and the printed circuit board; and at least one Hall sensor module.

At least one of the low-resistance metal portions of the bus bar includes a sensor hole 201c or 201d. At least a portion of the Hall sensor module is inserted into the sensor hole 201c or 201d.

Advantageous Effects

The present invention implements a current sensing device incorporating a shunt sensor resistor and a Hall sensor, thereby improving the measurement accuracy of current.

According to the present invention, an integrated circuit (IC) chip of a Hall sensor is disposed in a sensor hole formed in a bus bar to improve the measurement accuracy of a current of the Hall sensor on the bus bar without a separate metal shield can surrounding the bus bar.

According to the present invention, when the resistor of the shunt sensor is overheated, the accuracy of a measured current value can be maintained by selecting a measured current value of the Hall sensor.

According to the present invention, it is possible to measure current at high side of a battery to which a high voltage (400 to 800 V) is applied, with high accuracy. According to the present invention, it is possible to measure the current flowing on a bus bar connected to at least one of the high side and/or low side of a battery even in a harsh environment.

According to the present invention, it is possible to measure a current with a differential signal that is resistant to noise and to provide a measured current value as a digital signal to an external controller.

According to the present invention, at least one of one or more shunt sensors and one or more Hall sensors may be utilized as a back-up sensor, thereby improving the stability of a current sensor.

Effects of the present invention should not be limited to the aforementioned effects and other unmentioned effects will be clearly understood by those skilled in the art from the claims.

MODE FOR INVENTION

Figure 1A:
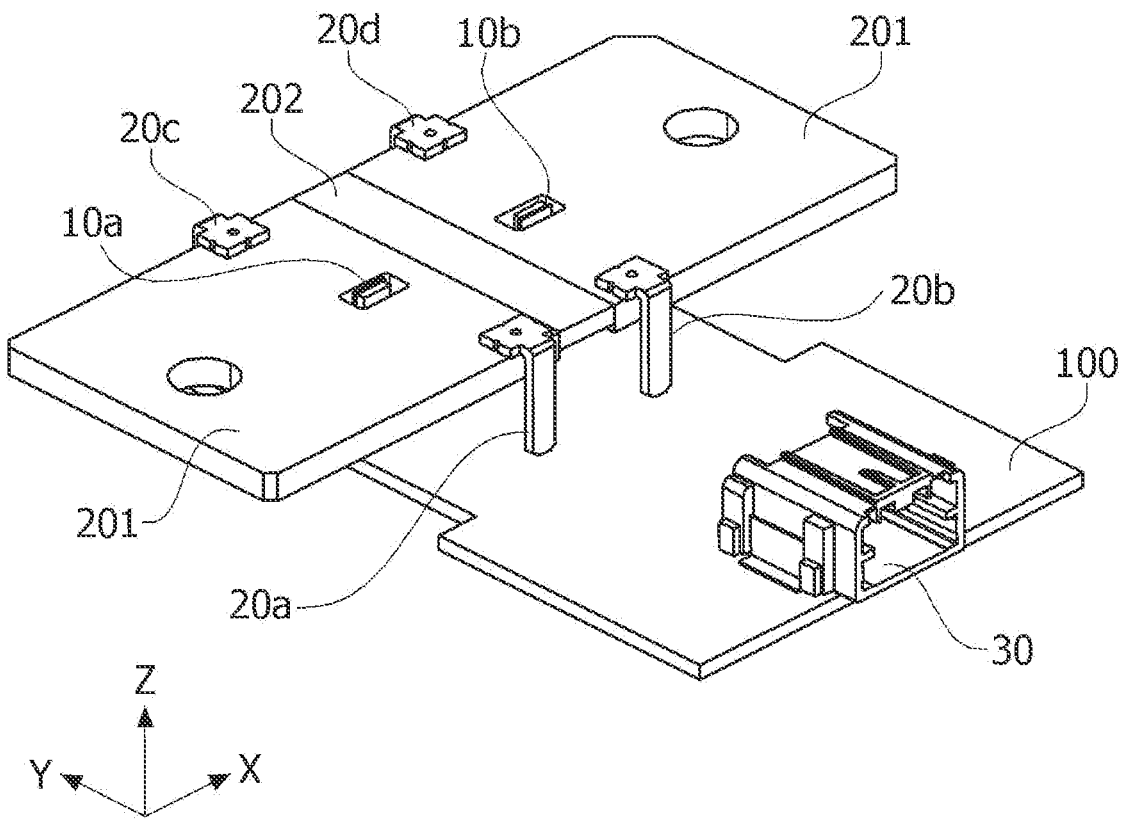
FIGS. 1A to 1C are views showing a current sensing device according to an embodiment of the present invention from different angles.
Figure 1B:
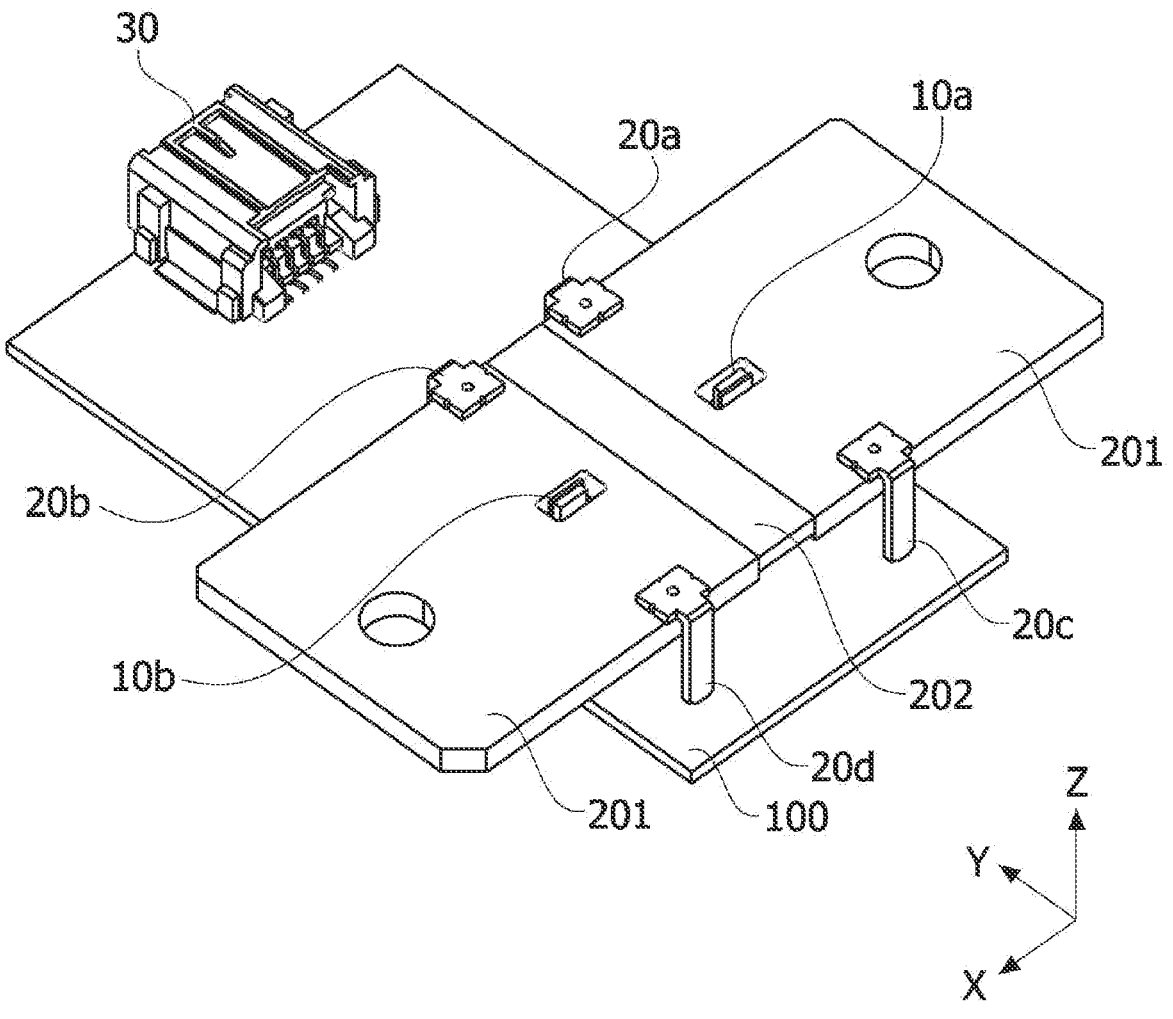
Figure 1C:
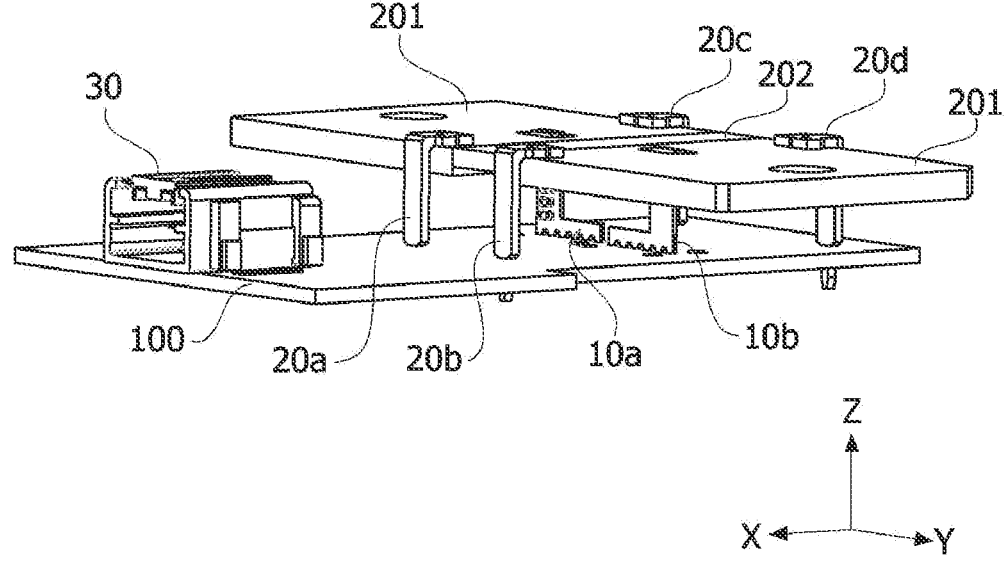

The merits and characteristics of the present invention and a method of achieving the merits and characteristics will become more apparent from the embodiments described in detail in conjunction with the accompanying drawings. However, the present invention is not limited to the disclosed embodiments, but may be implemented in various different ways. The embodiments are provided to only complete the disclosure and to allow those skilled in the art to fully understand the category of the disclosure. The disclosure is defined by the category of the claims.

A shape, a size, a ratio, an angle, and a number disclosed in the drawings for describing embodiments of the present disclosure are merely an example, and thus, the present invention is not limited to the illustrated details. The same reference numerals will be used to refer to the same or similar elements throughout the specification. Also, in the following description, when the detailed description of the relevant known function or configuration is determined to unnecessarily obscure the important point of the present invention, the detailed description will be omitted.

In a case where "comprise," "have," and "include" described in the present specification are used, another part may be added unless "only" is used. A singular expression can include a plural expression as long as it does not have an apparently different meaning in context.

In construing an element, the element is construed as including an error region although there is no explicit description.

In the description of positional relationships, when a structure is described as being positioned "on or above," "under or below," or "next to" another structure, this description should be construed as including a case in which the structures directly contact each other as well as a case in which a third structure is disposed therebetween.

The terms "first," "second," etc. may be used to distinguish various components. However, functions or structures of the components are not limited by names of the components and ordinal numbers prefixed to the component names.

The features of embodiments of the disclosure can be partially combined or entirely combined with each other, and can be technically interlocking-driven in various ways. The embodiments can be independently implemented, or can be implemented in conjunction with each other.

Hereinafter, various embodiments of the present invention will be described in detail with reference to the accompanying drawings.

Referring to FIGS. 1A to 4, a current sensing device according to an embodiment of the present invention includes one or more shunt sensors and one or more Hall sensors configured to measure a current flowing through a bus bar 200.

The shunt sensor includes a plurality of fixing pins 20a to 20d connected near a resistor of the bus bar 200, and an amplifier. The shunt sensor measures the current (shunt current) flowing through the fixing pins 20a to 20d.

The Hall sensor measures the current flowing through the bus bar 200 by detecting and amplifying Hall voltage in a magnetic field generated by the current flowing through the bus bar 200.

An output signal of each of the shunt sensor and the Hall sensor may be converted into a digital signal through an analog-to-digital converter (hereinafter referred to as "ADC"). The ADC may be independently connected to each of the shunt sensor and the hall sensor, or shared by them.

The bus bar 200 is manufactured as a linear or rectangular metal bar. The bus bar 200 has a length dimension along the x-axis direction, a width dimension along the y-axis direction, and a thickness dimension along the z-axis direction.

Figure 2A:
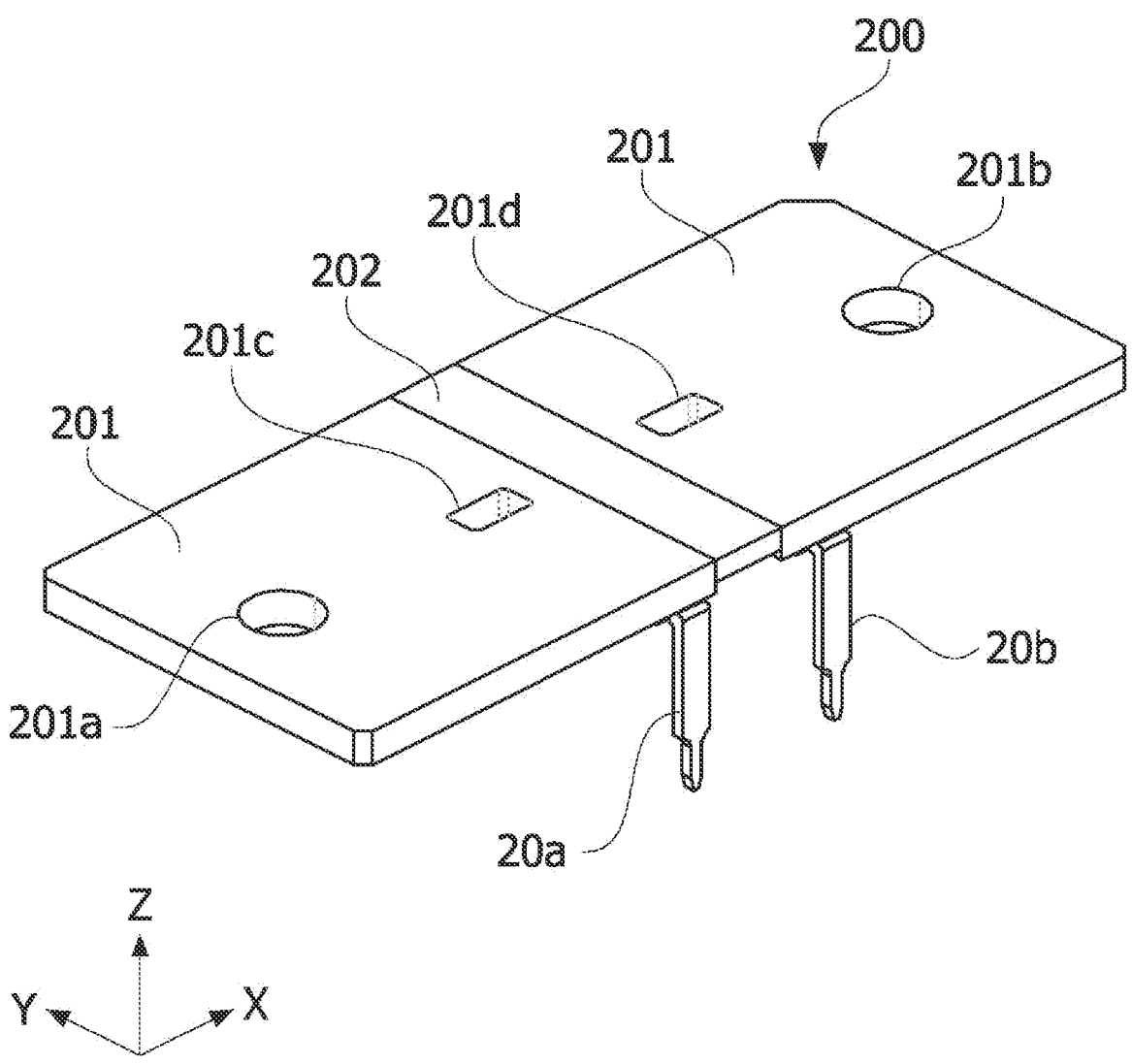
FIGS. 2A and 2B are views showing in detail the structure of a bus bar and the structure of a fixing pin.
Figure 2B:
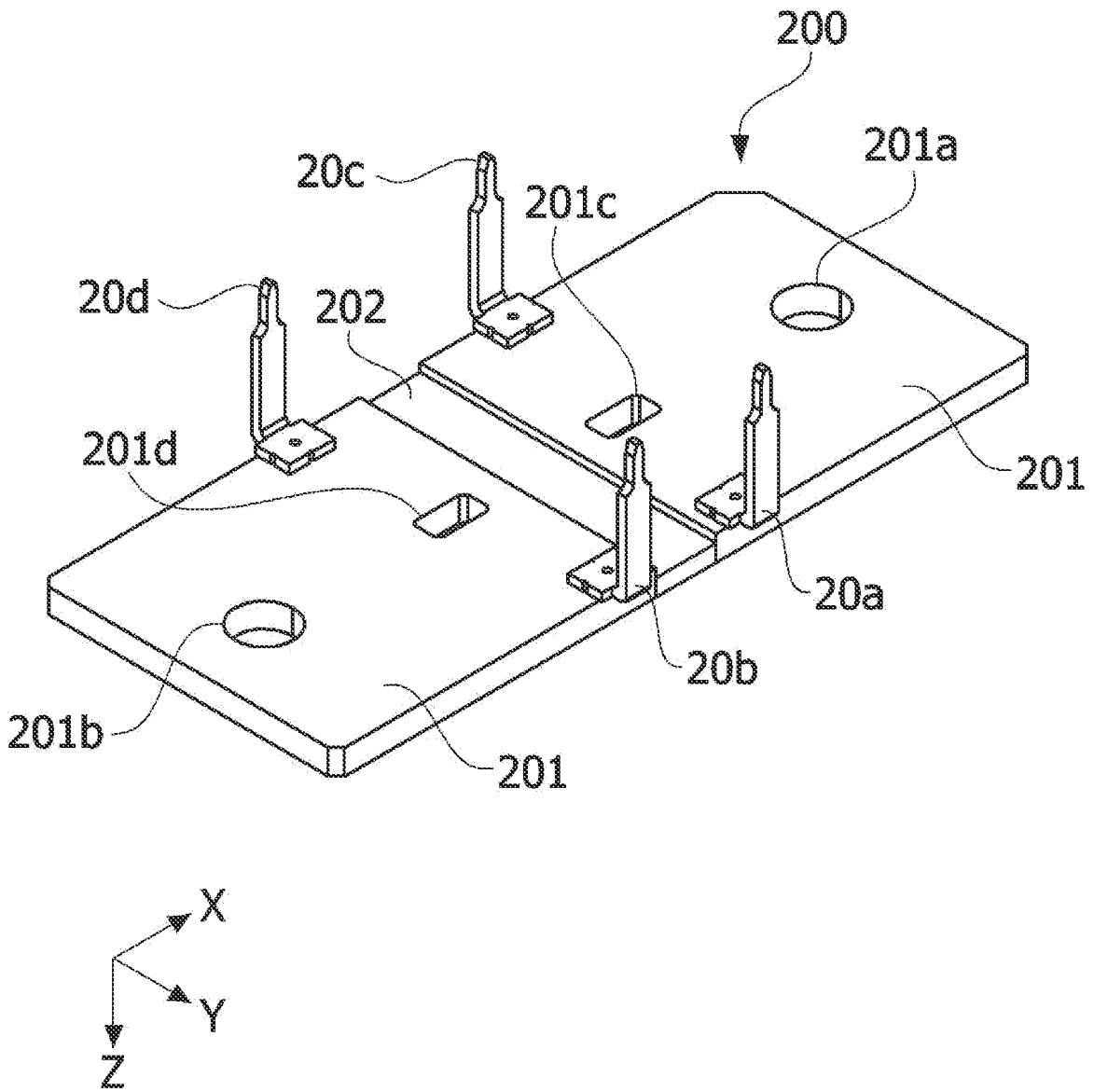

As shown in FIG. 2, the bus bar 200 includes low-resistance metal portions 201 and a resistance portion 202 which is disposed between the low-resistance metal portions 201 and connects the metal portions 201. The resistance portion 202 may be made of metal having a higher resistance value than the low-resistance metal portions 201 and may be joined to the low-resistance metal portions 201 by welding or soldering. The low-resistance metal portions 201 may be made of a copper (Cu) plate, and the resistance portion 202 may be made of managing, but the present invention is not limited thereto. The resistance value may be set to a desired design value by adjusting the material, size, and the like of the resistance portion 202. For example, the resistance value of the resistance portion 202 may be set to a value between 40 μΩ and 60 μΩ, but is not limited thereto.

The low-resistance metal portions 201 of the bus bar 200 include respectively connection holes 201a and 201b and sensor holes 201c and 201d. The connection holes 201a and 201b and the sensor holes 201c and 201d penetrate through the metal portions 201. The sensor holes 201c and 201d may be positioned closer to the resistance portion 202 than the connection holes 201a and 201b. The sensor holes 201c and 201d may be rectangular holes of a smaller size than the connection holes 201a and 201b. The sensor holes 201c and 201d are preferably disposed symmetrically with respect to the resistance portion 202 interposed therebetween to reduce a bottleneck phenomenon for bidirectional current flow during charging/discharging of a battery. Due to the sensor holes 201c and 201d, heat generated in the resistance portion 202 of the shunt sensor is hardly transferred to an integrated circuit (IC) chip of the Hall sensor. Therefore, even if the resistance portion 202 is heated, the measurement accuracy of current in the Hall sensor does not change.

An external electronic device or a power supply source may be connected to the bus bar 200 through the connection holes 201a and 201b. For example, a battery may be connected to the bus bar 200 with a bolt fixed to the bus bar 200 through a first connection hole 201a. An external load, for example, a motor or a generator, may be connected to the bus bar 200 with a bolt fixed to the bus bar 200 through a second connection hole 201b.

When one Hall sensor is disposed in the current sensing device, the sensor hole 201c or 201d may be disposed in only one of two low-resistance metal portions 201. When two Hall sensors are required, the sensor holes 201c and 201d are respectively disposed on each of the low-resistance metal portions 201. The sensor holes 201c and 201d are disposed on the metal portions 201 at a predetermined distance from the resistance portion 202. The Hall sensor is inserted into at least one of the sensing holes 201c and 201d. The size of the sensor holes 201c and 201d are set to an appropriate size such that there is clearance with the Hall sensor.

The current sensing device includes a printed circuit board (hereinafter referred to as "PCB", 100) disposed below the bus bar 200, and a plurality of fixing pins 20a to 20d configured to fix the bus bar 200 to the PCB 100, and at least one or more Hall sensor modules 10a and 10b partially inserted into the sensor holes 201c and 201d of the bus bar 200.

The bus bar 200 and the PCB 100 are arranged in parallel and intersect with each other. The longitudinal direction of the bus bar 200 and the longitudinal direction of the PCB 100 may perpendicularly intersect with each other. At the overlapping area where the bus bar 200 and the PCB 100 intersect, the fixing pins 20a to 20d and at least one Hall sensor module 10a and 10b stand vertically on the PCB 100.

The fixing pins 20a to 20d may include at least one pair of fixing pins arranged with the resistance portion 202 of the bus bar 200 interposed therebetween. The fixing pins 20a to 20d may be made of metal having a low resistance, for example, copper (Cu), or realized as silver-plated copper pins.

A pair of fixing pins is sufficient when only one shunt current value of the bus bar 200 is required, but two pairs of fixing pins are preferable so that the bus bar 200 can be stably fixed to the PCB 100. Two pairs of fixing pins enable measurement of shunt currents flowing through both sides of the bus bar. For example, a first pair of fixing pins 20a and 20b may provide a shunt current path flowing through one side of the bus bar 200, and a second pair of fixing pins 20*c* and 20*d* may provide a shunt current path flowing through the other side of the bus bar 200.

The spacing between the first pair of fixing pins 20*a* and 20*b* may be set to differ from the spacing between the second pair of fixing pins 20*c* and 20*d*. In this case, it is easy to assemble the bus bar 200 and the PCB 100 without confusing directions.

The upper ends of the fixing pins 20*a* to 20*d* may be bent at right angles and fixed to the low-resistance metal portions 201 of the bus bar by welding or soldering. The fixing pins 20*a* to 20*d* have a small width at the lower ends. Each of the fixing pins 20*a* to 20*d* is inserted into the hole formed on the PCB 100. Accordingly, the fixing pins 20*a* to 20*d* may be fitted to the PCB 100 to be fixed thereto and may vertically stand on the PCB 100 to support the bus bar 200 from below.

Each Hall sensor module 10*a* and 10*b* includes a sensor substrate 11, a Hall sensor chip 12 mounted on the sensor substrate 11, and one or more capacitors 13. The Hall sensor chip 12 may be mounted on an upper end of the sensor substrate 11, and the capacitors 13 may be mounted on a middler portion of the sensor substrate 11. The Hall sensor chip 12 is disposed in the sensor hole 201*c* or 201*d* of the bus bar 200 and amplifies Hall voltage in the magnetic field on the bus bar 200. The capacitors 13 remove high-frequency noise from an output signal of the Hall sensor chip 120.

A lower end of the sensor substrate 11 includes a number of pins split from each other from the middle portion. The lower pins of the sensor substrate 11 are inserted into the holes of the PCB 100. Accordingly, each Hall sensor module 10*a* and 10*b* is fitted to the PCB 100 to be fixed thereto, and vertically stands on the PCB 100. At least a portion of the Hall sensor chip 12 mounted on the upper end of each Hall sensor module 10*a* and 10*b* is disposed in the sensor hole 201*c* and 201*d* of the bus bar 200.

Circuit elements, such as an ADC, a communication module, a transformer, a temperature sensor, etc., and a connector 30 are mounted on the PCB 100. The PCB 100 includes wires that electrically connect the circuit elements, the fixing pins 20*a* to 20*d*, the Hall sensor modules 10*a* and 10*b*, and the connector 30 in a preset layout.

The temperature sensor may be implemented as at least one of bimetal, a thermocouple, a thermistor, a resistance temperature sensor, or a semiconductor temperature sensor using a PN junction.

The PCB 100 includes a plurality of first holes 101*a* to 101*d* into which the lower ends of the fixing pins 20*a* to 20*d* are inserted, and one or more second holes 102*a* and 102*b* into which the lower ends of the Hall sensor modules 10*a* and 10*b* are inserted.

Figure 3:
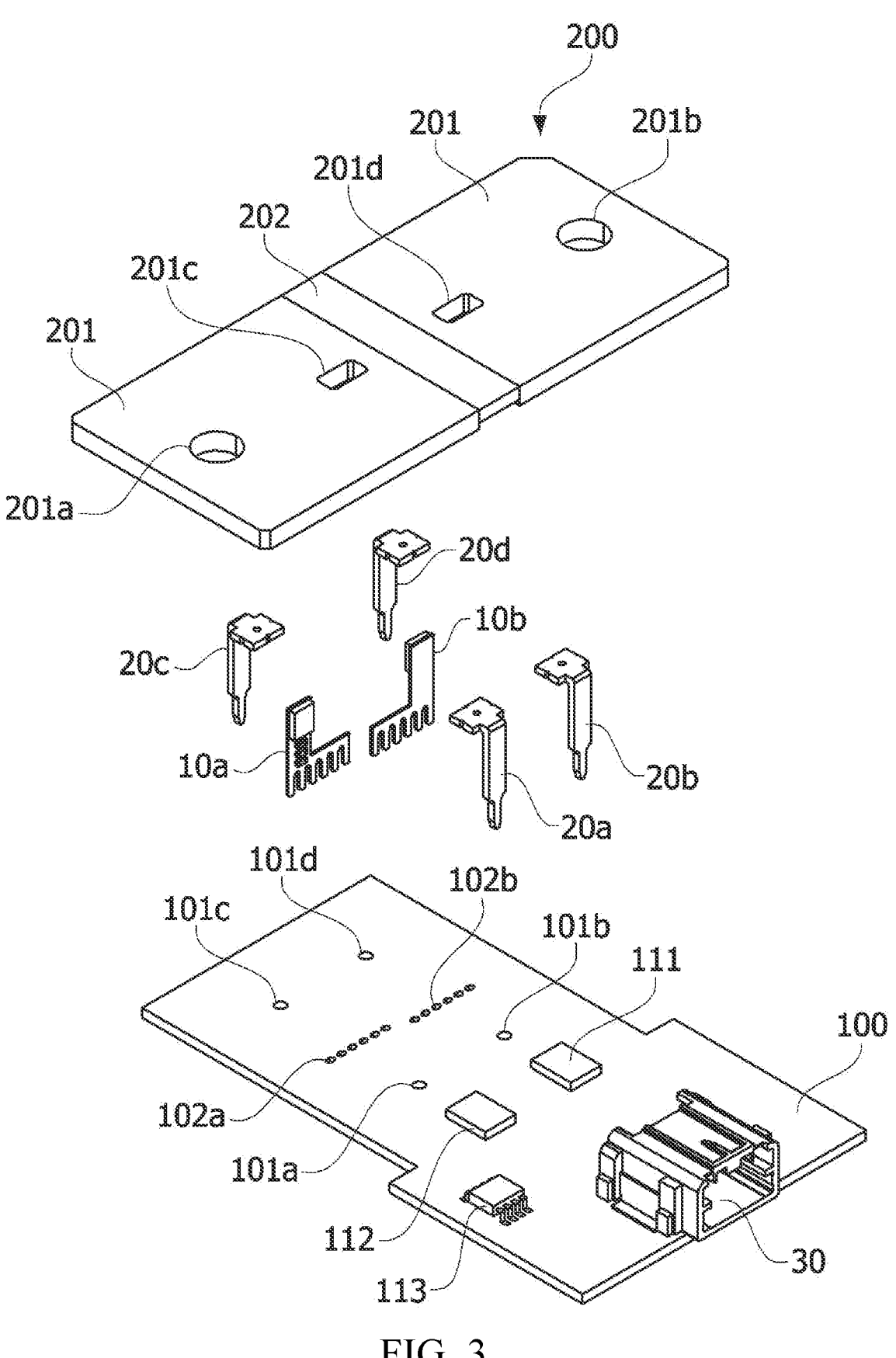
FIG. 3 is an exploded perspective view showing components of the current sensing device in a disassembled state.
Figure 4:
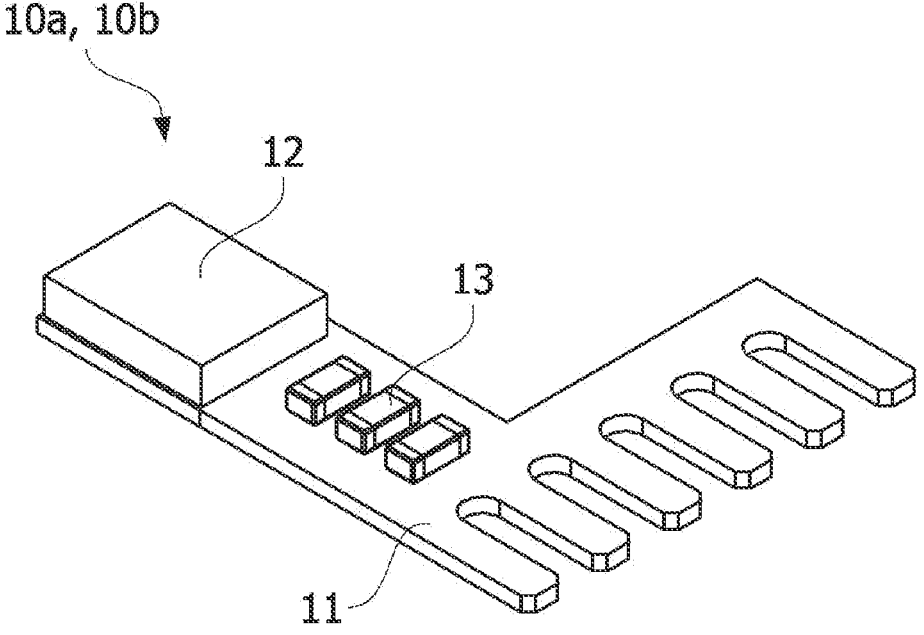
FIG. 4 is an enlarged view showing a Hall sensor module from another angle.
Figure 5:
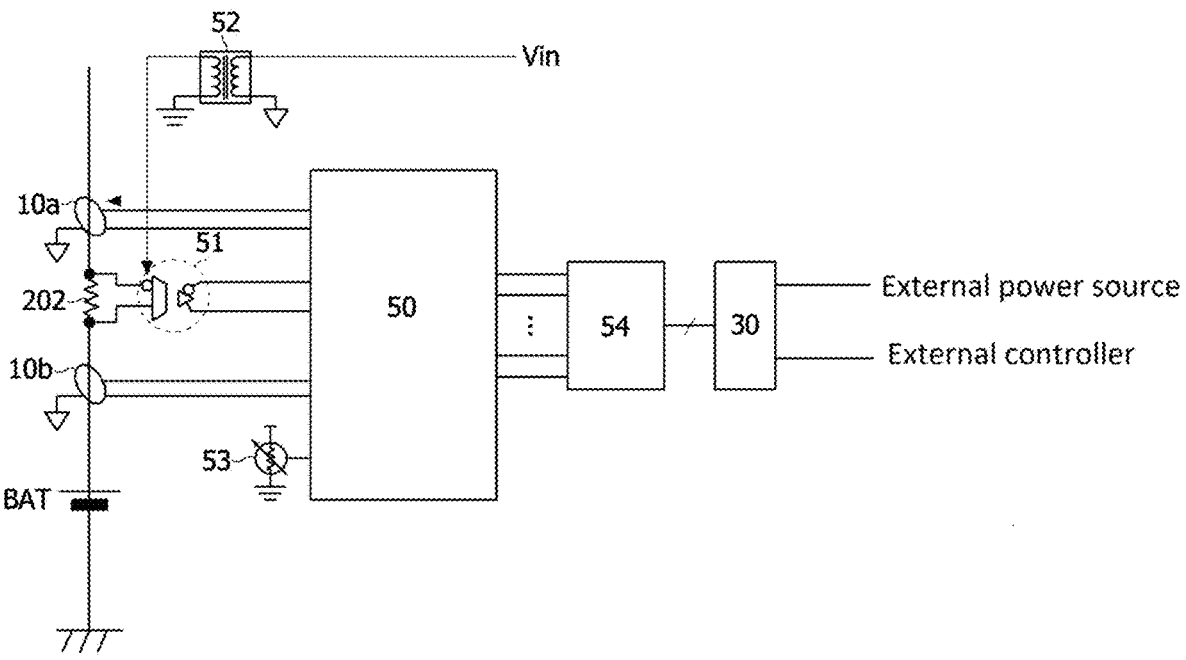
FIGS. 5 to 7 are circuit diagrams illustrating current sensing devices according to various embodiments of the present invention.
Figure 6:
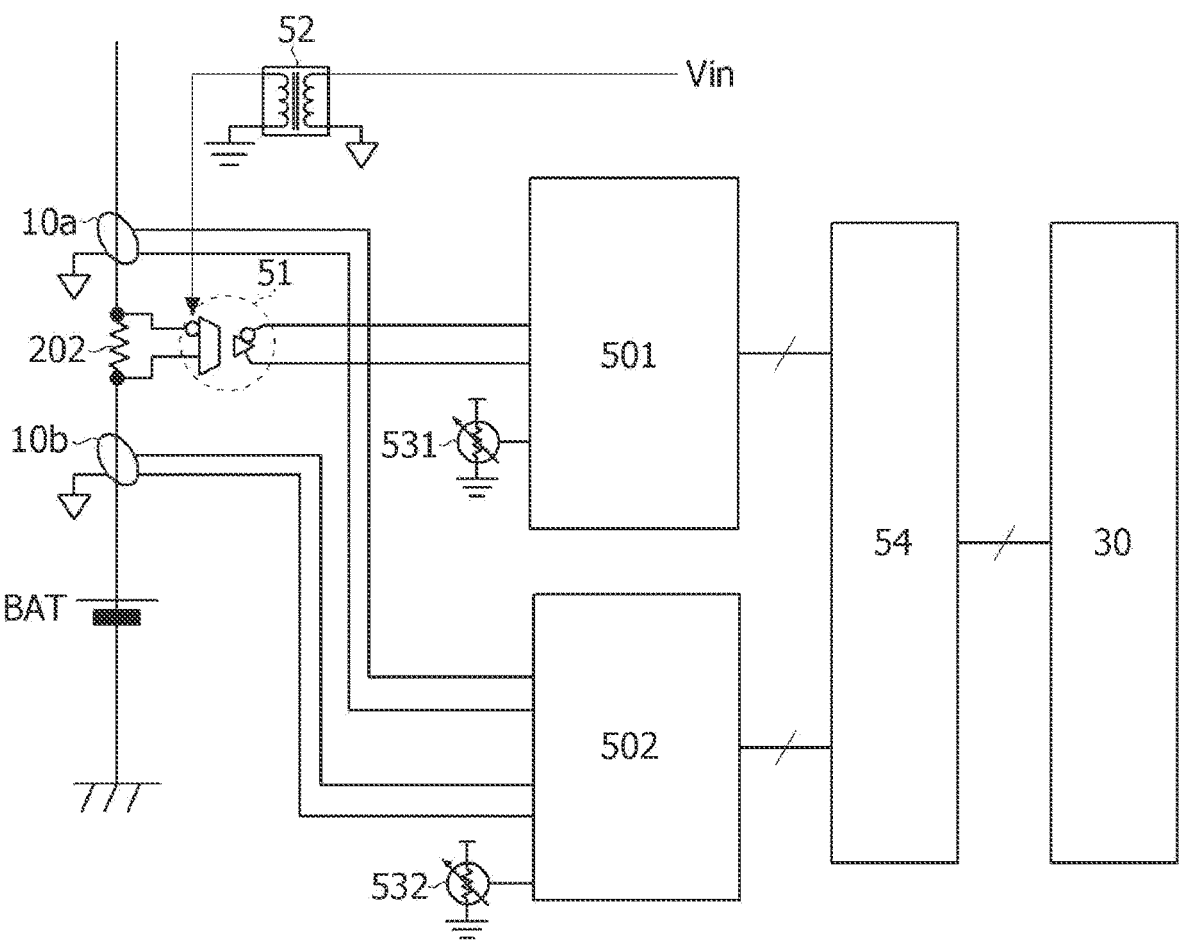
Figure 7:
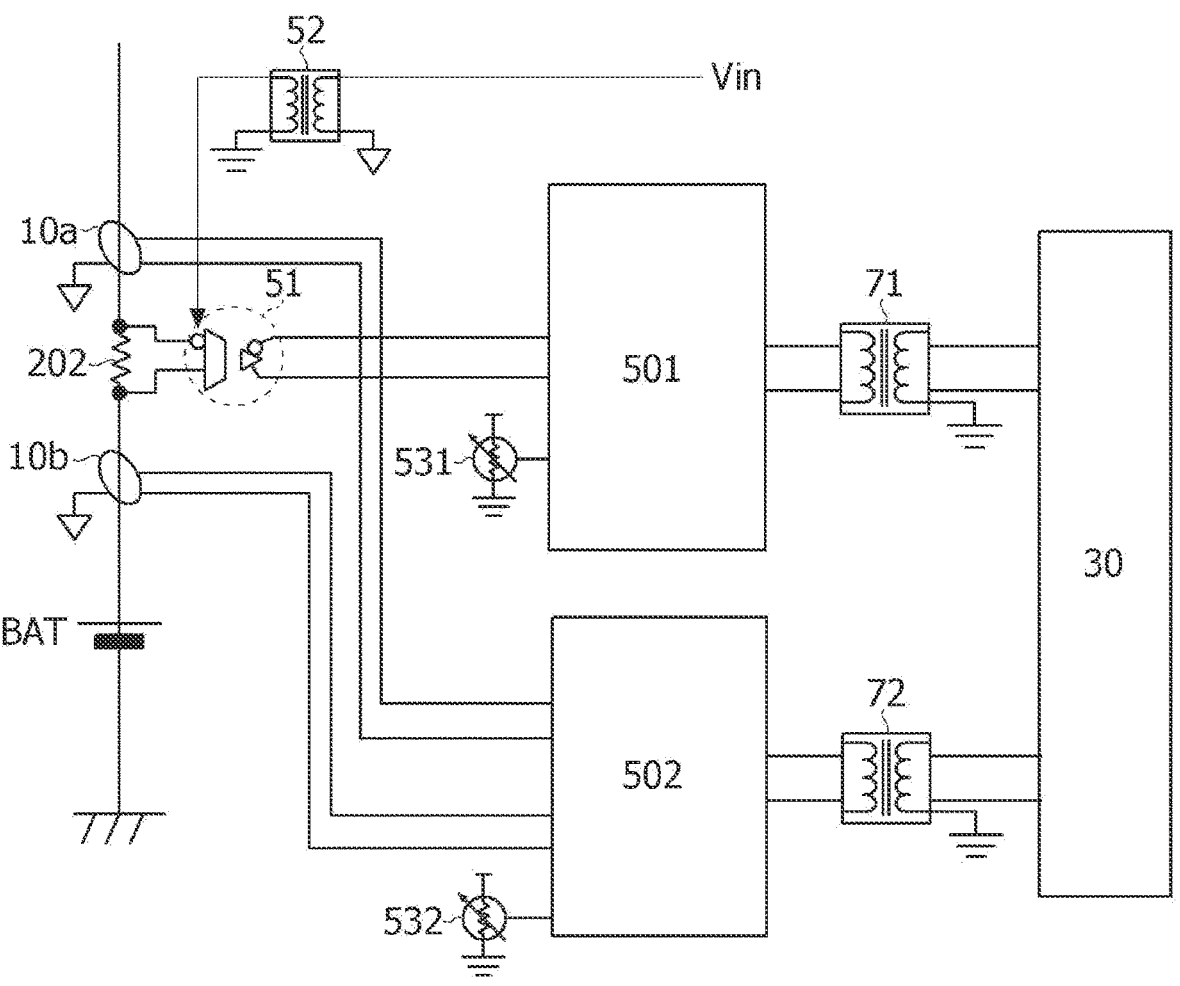

A circuit of the current sensing devices shown in FIGS. 5 to 7 may be mounted on the PCB 100. In FIG. 3, a first circuit element 111 may be an IC that includes an ADC configured to convert analog output signals of the shunt sensors and the Hall sensors into digital signals. A second circuit element 112 may be an IC that includes a wired/ wireless communication module. The communication module may transmit (Tx) an output signal of the ADC, that is, a sensor output signal in digital form, to an external electronic device through the connector 30, and receive (Rx) a signal from the external electronic device. A third circuit element 113 may be an IC that includes a transformer configured to supply external power source to the amplifier of the shunt sensor.

The connector 30 is mounted on the PCB 100. The external power source is supplied to the PCB through the connector 30, and the digital output signals of the shunt sensor and the Hall sensor, which are output from the PCB, are output to an external controller through a wired/wireless communication link. In addition, a signal from the external controller may be received by the PCB 100 through the connector 30.

The PCB 100 may include an isolation element having resistance to overvoltage and overcurrent in order to protect the circuit elements from the overvoltage and overcurrent when current at high side of a battery is measured. The isolation elements may include transformers, isolation amplifiers, isolators, and the like.

The external controller may be a battery management system (BMS), but is not limited thereto. The BMS may request the PCB 100 for current sensing. The BMS may control voltage balancing of battery cells and prevent the battery cells from overloading by determining current of the battery cells on the basis of the output signal of the shunt sensor, the output signal of the Hall sensor, and the output signal of the temperature signal, which are received from the PCB 100.

The BMS may accurately determine the current flowing in the battery cells by selecting a more accurate current value between the output signal of the shunt sensor and the output signal of the Hall sensor. For example, the shunt sensor may have lower accuracy of a measured current value at high current due to heat generated in the resistance portion 202. The BMS may determine temperature of the shunt sensor based on the output signal of the temperature sensor. When the resistance temperature of the shunt sensor rises above a preset threshold, the BMS may ignore the measured current value of the shunt sensor and select the measured current value of the Hall sensor, thereby maintaining the accuracy of the measured current value.

The current sensing device of the present invention may measure the current flowing through the bus bar 200 with a dual sensing structure that uses the shunt sensor and the Hall sensor. The current sensing device may measure current flowing on the bus bar 200 connected to at least one of the high side and low side of a battery, through the bus bar 200. Also, the current sensing device may measure a current with a differential signal that is resistant to noise, and provide a measured current value as a digital signal to the external controller.

FIGS. 5 to 7 are circuit diagrams illustrating current sensing devices according to various embodiments of the present invention.

Referring to FIG. 5, a current sensing device includes an isolation amplifier 51, a first transformer 52, a temperature sensor 53, an IC 50, and a communication module 54.

The current sensing device measures the current flowing in the bus bar 200 by using a shunt sensor and a Hall sensor disposed on the bus bar 200 connected to at least one of the high side and low side of a battery BAT.

The isolation amplifier 51 is connected to fixing pins 20*a* to 20*d*, amplifies voltage of the fixing pins 20*a* to 20*d*, and supplies the amplified voltage to the IC 50. The isolation amplifier 51 has an isolation barrier between an input side and an output side. Input terminals of the isolation amplifier 51 are connected to the fixing pins 20*a* to 20*d*. Output terminals of the isolation amplifier 51 are connected to input terminals of the IC 50. The isolation amplifier 51 amplifies the voltage across a resistance portion 202 in the bus bar 200 and outputs a differential signal.

The first transformer 52 includes a primary-side coil to which a DC input voltage Vin is applied, and a secondary-side coil connected to a driving voltage terminal of the isolation amplifier 51. The low drop output regulator (LDO)

omitted from the drawings may convert the voltage of an external power source Aux PWR into direct current voltage capable of driving the insulation amplifier 51 and the temperature sensor 53 and apply the direct current voltage to the primary-side coil of the first transformer 52. The primary-side and secondary-side coils of the first transformer 52 may have the same number of windings. Therefore, the voltage level in the first transformer 52 does not change and a primary-side voltage is induced to a secondary-side voltage.

Any one of first and second Hall sensor modules 10a and 10b may be utilized as a back-up sensor. The first and second Hall sensor modules 10a and 10b amplify the Hall current measured based on a magnetic field on the bus bar 200 and output the amplified Hall current to the input terminals of the IC 50. Each of the first and second Hall sensor modules 10a and 10b may output the measured current value in the form of a differential signal.

The IC 50 receives differential signals from each of the isolation amplifier 51, the temperature sensor 53, and the Hall sensor modules 10a and 10b.

The IC 50 measures the shunt current flowing on the bus bar 200 from the output signal (differential signal) of the isolation amplifier 51, converts the measured shunt current value (measured current value of the shunt sensor) into a digital signal through an ADC, and outputs the digital signal. The IC 50 derives a measured temperature value from the output signal (differential signal) of the temperature sensor 53 and converts the measured temperature value into a digital signal through the ADC. The IC 50 measures the current flowing on the bus bar 200 from the output signals (differential signals) of the Hall sensor modules 10a and 10b and converts the measured current value into a digital signal through the ADC. The measured current values of the shunt sensor and the Hall sensor and the measured temperature value, which are the digital signals output from the IC 50, are output through the wired/wireless communication module 54.

The communication module 54 transmits the digital signals output from the IC 50 to an external controller through a standard wired/wireless communication interface. When the communication module 54 outputs data through a wired communication interface, output terminals of the communication module 54 are connected to the external controller through a connector 30. When the communication module 54 outputs data through a wireless communication interface, the data may be transmitted as a wireless signal to the external controller without passing through the connector 30. The communication module 54 may transmit a signal from the external controller, for example, a current sensing request signal, to the IC 50 through the wired/wireless communication interface.

The IC 50 may be divided into a first IC 501 and a second IC 502 as shown in FIG. 6. The first IC 501 converts the output signal of the isolation amplifier 51 into a digital signal through an ADC and outputs the digital signal. The first IC 501 may convert an output signal of a first temperature sensor 531 into a digital signal through an ADC and output the digital signal.

The second IC 502 converts the output signals of the Hall sensor modules 10a and 10b into digital signals through the ADC and outputs the digital signals. The second IC 502 may convert an output signal of a second temperature sensor 532 into a digital signal through the ADC and output the digital signal.

The communication module 54 may be omitted. For example, the digital signals output from the ICs 50, 501, and

502 may be transmitted to the external controller through second and third transformers 71 and 72 shown in FIG. 7 and the connector 30. The second transformer 71 may be connected between an output terminal of the first IC 501 and the connector 30. The third transformer 72 may be connected between an output terminal of the second IC 502 and the connector 30.

Each of the second and third transformers 71 and 72 includes a primary-side coil connected to the output terminals of the ICs 50, 501, and 502 and a secondary-side coil connected to the connector 30. The primary-side and secondary-side coils of the second and third transformers 71 and 72 may have the same number of windings. Therefore, the voltage level in the second and third transformers 71 and 72 does not change and a primary-side voltage is induced to a secondary-side voltage.

Since the isolation amplifier 51 and the transformers 52, 71, and 72 each have an isolator between the input side and output side thereof, an insulation path is provided to protect circuit elements from overcurrent and overvoltage. A ground plane on the PCB 100 may be divided into two sections with the insulation path interposed therebetween.

Since the content of the present disclosure described in the technical problem, the technical solution, and the advantageous effects does not specify essential features of the claims, the scope of the claims is not limited to matters described in the content of the disclosure.

While the embodiments of the present invention have been described in detail above with reference to the accompanying drawings, the present invention is not limited to the embodiments, and various changes and modifications may be made without departing from the technical idea of the present invention. Accordingly, the embodiments disclosed herein are to be considered descriptive and not restrictive of the technical idea of the present invention, and the scope of the technical idea of the present invention is not limited by the embodiments. Therefore, it should be understood that the above embodiments are illustrative rather than restrictive in all respects. The scope of the present invention should be construed by the appended claims, and all technical idea within the scopes of their equivalents should be construed as being included in the scope of the present invention.

INDUSTRIAL APPLICABILITY

The present invention can be applied to devices in various industrial areas where current sensors are used so that it can improve the measurement accuracy of current. According to the present invention, it is possible to improve the measurement accuracy of current without the need for a separate metal shield can when incorporating a shunt sensor and a Hall sensor.

According to the present invention, it is possible to measure current at high side of a battery to which a high voltage (400 to 800 V) is applied, with high accuracy. According to the present invention, it is possible to measure the current flowing on a bus bar connected to at least one of the high side and/or low side of a battery even in a harsh environment.

According to the present invention, it is possible to measure a current with a differential signal that is resistant to noise and to provide a measured current value as a digital signal to an external controller.

According to the present invention, at least one of one or more shunt sensors and one or more Hall sensors may be utilized as a back-up sensor, thereby improving the stability of a current sensor.

The invention claimed is:

1. A current sensing device comprising:

a bus bar including two low-resistance metal portions separated from each other with a resistance portion therebetween;

a printed circuit board arranged below the bus bar;

a plurality of fixing pins which are joined to the metal portions of the bus bar to fix the bus bar on the printed circuit board and provide a current path between the metal portions and the printed circuit board; and two Hall sensor modules, wherein each of the two low-resistance metal portions comprises a sensor hole, wherein each of the two Hall sensor modules is at least partially inserted into the corresponding sensor hole, and wherein the two sensor holes are disposed symmetrically with respect to the resistance portion interposed therebetween.

2. The current sensing device of claim 1, wherein at an overlapping area where the bus bar and the printed circuit board are arranged in parallel and intersect with each other, the fixing pins and the Hall sensor modules vertically stand on the printed circuit board.

3. The current sensing device of claim 2, wherein the printed circuit board comprises: a plurality of first holes into which lower ends of the fixing pins are inserted; and one or more second holes into which a lower end of each Hall sensor module is inserted.

4. The current sensing device of claim 3, wherein the printed circuit board further comprises a connector, and through the connector, an external power source is supplied to the printed circuit board and a digital signal output from the printed circuit board is transmitted to an external controller.

5. The current sensing device of claim 3, wherein the printed circuit board comprises:

an isolation amplifier connected to the fixing pins;

a first transformer configured to supply an external power source to the isolation amplifier;

a temperature sensor; and an integrated circuit configured to convert an analog output signal of each of the isolation amplifier, the Hall sensor modules, and the temperature sensor into a digital signal and output the digital signal.

6. The current sensing device of claim 5, wherein the printed circuit board further comprises a communication module configured to transmit the digital signal output from the integrated circuit to an external controller through a wired/wireless communication interface and transmit a signal received from the external controller to the integrated circuit through the wired/wireless communication interface.

7. The current sensing device of claim 5, wherein the integrated circuit comprises: a first integrated circuit configured to convert the output signal of the isolation amplifier into a digital signal and output the digital signal; and a second integrated circuit configured to convert the output signal of the Hall sensor modules into a digital signal and output the digital signal.

8. The current sensing device of claim 5, wherein the printed circuit board further comprises a transformer connected between the integrated circuit and the connector.

9. The current sensing device of any one of claims 1 to 8, wherein the bus bar is connected at least one of high side and low side of a battery.

10. The current sensing device of claim 4, wherein the external controller comprises a battery management system.

* * * * *